United States Patent
Namie et al.

(10) Patent No.: US 8,564,366 B2
(45) Date of Patent: Oct. 22, 2013

(54) HIGH-FREQUENCY POWER AMPLIFIER DEVICE

(75) Inventors: Hisanori Namie, Kanagawa (JP); Masashi Maruyama, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 68 days.

(21) Appl. No.: 13/309,629

(22) Filed: Dec. 2, 2011

(65) Prior Publication Data
US 2012/0154043 A1   Jun. 21, 2012

(30) Foreign Application Priority Data
Dec. 16, 2010   (JP) ................................. 2010-280296

(51) Int. Cl.
*H03F 1/14*   (2006.01)
*H03F 3/68*   (2006.01)
*H03F 3/195*  (2006.01)

(52) U.S. Cl.
USPC ............................. 330/51; 330/295; 330/307

(58) Field of Classification Search
USPC .................... 330/51, 295, 302, 307
See application file for complete search history.

(56) References Cited

U.S. PATENT DOCUMENTS

| 7,135,919 B2 | 11/2006 | Chen |
| 7,952,433 B2* | 5/2011 | An et al. ...................... 330/295 |
| 2010/0253435 A1* | 10/2010 | Ichitsubo et al. ............. 330/295 |

* cited by examiner

*Primary Examiner* — Steven J Mottola
(74) *Attorney, Agent, or Firm* — Mattingly & Malur, PC

(57) ABSTRACT

Disclosed is a high-frequency power amplifier device capable of reducing a talk current. For example, the high-frequency power amplifier device has first and second power amplifier circuits, first and second transmission lines, and a region in which the first and second transmission lines are disposed close to each other. Either the first or second power amplifier circuit becomes activated in accordance with an output level. When the second power amplifier circuit is activated, currents flowing in the first and second transmission lines are transmitted in the same direction so that magnetic coupling occurs to strengthen each transmission line's magnetic force. When, on the other hand, the first power amplifier circuit is activated, currents flowing in the first and second transmission lines are transmitted in the opposite directions so that magnetic coupling occurs to weaken each transmission line's magnetic force.

18 Claims, 11 Drawing Sheets

HIGH-FREQUENCY POWER AMPLIFIER DEVICE

CROSS-REFERENCE TO RELATED APPLICATIONS

The disclosure of Japanese Patent Application No. 2010-280296 field on Dec. 16, 2010 including the specification, drawings, and abstract is incorporated herein by reference in its entirety.

BACKGROUND

The present invention relates to a high-frequency power amplifier device, and more particularly to an effective technology applicable to a high-frequency power amplifier device that, in accordance with an output level setting for transmission, changes the transistor to be used.

In a configuration described, for instance, in U.S. Pat. No. 7,135,919, a first amplifier and a second amplifier are coupled to a common output node. The first and second amplifiers are complementarily activated. A transmission line having a length of λ/4 is provided between the second amplifier and the common output node.

SUMMARY

In recent years, it is demanded that a high-frequency power amplifier device (high-frequency power amplifier module), which implements the transmission functionality, for instance, of a mobile phone, become smaller in size and reduce a talk current. The talk current is an integral value of the probability distribution of each output level use frequency for transmission and the consumption current of each output level. Reducing the talk current makes it possible, for example, to decrease the power consumption, for instance, of the mobile phone and increase the life of its battery. FIG. 10 shows an example of the probability distribution of each output level use frequency in a W-CDMA (Wideband Code Division Multiple Access) mobile phone. As shown in FIG. 10, low to medium output levels centered around 0 dBm are frequently used in, for instance, the W-CDMA mobile phone. Therefore, increasing the power-added efficiency (PAE) of the high-frequency power amplifier module at the low to medium output levels is beneficial for talk current reduction.

The power-added efficiency at the low to medium output levels can be increased, for instance, by using a configuration shown in FIGS. 11A to 11C. FIGS. 11A to 11C illustrate a high-frequency power amplifier device that has been studied as a premise of the present invention. FIG. 11A is a schematic diagram illustrating an example configuration of essential parts of the high-frequency power amplifier device. FIG. 11B shows exemplary characteristics of a main path shown in FIG. 11A. FIG. 11C shows exemplary characteristics of a sub path shown in FIG. 11A. The high-frequency power amplifier device shown in FIG. 11A includes a main power amplifier circuit (power amplifier circuit) PA2$m$, which amplifies a signal input from a common input node N2 through a capacitance C1, and a sub power amplifier circuit PA2$s$, which amplifies a signal input from the common input node N2 through a capacitance C2.

The output of the main power amplifier circuit PA2$m$ is coupled to one end of a transmission line LNmn, whereas the output of the sub power amplifier circuit PA2$s$ is coupled to one end of the transmission line LNmn through a transmission line LNsub. A capacitance C5 is coupled between the other end of the transmission line LNmn and an output node Pout. A capacitance C4 is coupled between the other end of the transmission line LNmn and a ground supply voltage GND. A capacitance C3 and an NMOS transistor MNsw are sequentially coupled to the output node (one end of the transmission line LNsub) of the sub power amplifier circuit PA2$s$ and directed to the ground supply voltage GND. A transistor included in the main power amplifier circuit PA2$m$ is larger in size than a transistor included in the sub power amplifier circuit PA2$s$. A high output level can be transmitted to the output node Pout by activating the main power amplifier circuit PA2$m$, deactivating the sub power amplifier circuit PA2$s$, exercising control to turn off the NMOS transistor MNsw with a control signal Vsw, and transmitting the output power of the main power amplifier circuit PA2$m$ to the output node Pout through the transmission line LNmn. The low to medium output levels can be transmitted to the output node Pout by activating the sub power amplifier circuit PA2$s$, deactivating the main power amplifier circuit PA2$m$, exercising control to turn on the NMOS transistor MNsw with the control signal Vsw, and transmitting the output power of the sub power amplifier circuit PA2$s$ to the output node Pout through the transmission line LNsub and the transmission line LNmn.

As described above, when the example configuration shown in FIG. 11A is used, the power amplifier circuit PA2$s$, which is small in transistor size, can achieve power amplification at the low to medium output levels. Therefore, the power-added efficiency (PAE) can be increased. However, it has been found that the example configuration might make it difficult to make an optimal design of the transmission line LNsub. First of all, when the main path operates due to the activation of the main power amplifier circuit PA2$m$, the impedance as viewed toward the transmission line LNsub from the output node of the main power amplifier circuit PA2$m$ is high because control is exercised to turn off the NMOS transistor MNsw. Ideally, therefore, no power loss occurs through the transmission line LNsub. In reality, however, the NMOS transistor MNsw has an OFF capacitance (Coff). Therefore, it is difficult to completely avoid power loss through the transmission line LNsub due to a series resonance circuit formed by the transmission line LNsub, the capacitance C3, and the OFF capacitance (Coff). As shown in FIG. 11B, the power loss increases (to decrease the PAE) with an increase in the length of the transmission line LNsub (with an increase in the amount of inductor component) because it decreases the resonance frequency of the series resonance circuit toward a carrier frequency.

Meanwhile, when the sub path operates due to the activation of the sub power amplifier circuit PA2$s$, the output impedance of the sub power amplifier circuit PA2$s$ (e.g., several tens of ohms) is converted to a predetermined impedance (e.g., 50 ohms) through the capacitance C3, the transmission line LNsub, the transmission line LNmn, the capacitance C4, and the capacitance C5 because control is exercised to turn on the NMOS transistor MNsw. In this instance, the PAE increases with an increase in the length of the transmission line LNsub as shown in FIG. 11C. The reason is that an adequate amount of clockwise rotation can be obtained in a Smith chart (immittance chart) as shown in FIG. 12 when the length of the transmission line LNsub is increased (when the amount of inductor component is increased). The obtained amount of clockwise rotation can then be combined with the capacitance C3 to effect adequate impedance conversion.

As described above, it is preferred that the transmission line LNsub be short to increase the power-added efficiency (PAE) during a main path operation. During a sub path operation, on the contrary, it is preferred that the transmission line LNsub be long to increase the PAE. To reduce the talk current and increase the overall PAE, therefore, it is necessary to device a scheme that will solve the above trade-off problem. It should be noted that the transmission line LNsub can be used as a stub during a main path operation while the length of the transmission line LNsub is, for example, λ/4. However, when, for instance, a W-CDMA frequency of 2 GHz is used, the value λ/4 represents approximately several centimeters. Thus, the high-frequency power amplifier module might not be reduced in size.

The present invention has been made in view of the above circumstances and provides a high-frequency power amplifier device capable of reducing the talk current. The foregoing and other advantages and novel features of the present invention will become apparent from the following detailed description and the accompanying drawings.

A representative embodiment of the present invention disclosed in this document is outlined below.

The high-frequency power amplifier device according to the representative embodiment of the present invention includes a first power amplifier circuit, a second power amplifier circuit, a first transmission line, a second transmission line, a first capacitance, a second capacitance, a transistor switch, and a control circuit. The first and second power amplifier circuits both amplify a first input signal. The first transmission line is coupled at one end to an output node of the first power amplifier circuit and coupled at the other end to the first capacitance. The second transmission line is coupled at one end to the output node of the first power amplifier circuit and coupled at the other end to an output node of the second power amplifier circuit. The second capacitance and the transistor switch are disposed in series between the output node of the second power amplifier circuit and a ground supply voltage. The control circuit activates either the first power amplifier circuit or the second power amplifier circuit in accordance with a mode setup signal. When the first power amplifier circuit is activated, the control circuit drives the transistor switch to turn off. When, on the other hand, the second power amplifier circuit is activated, the control circuit drives the transistor switch to turn on. The first and second transmission lines include a magnetic coupling region that is positioned close to the first and second transmission lines to cause magnetic coupling. In the magnetic coupling region, the first and second transmission lines are disposed so that the first transmission line originating from the output node side of the first power amplifier circuit is extended in the same direction as the second transmission line originating from the output node side of the second power amplifier circuit.

When the first power amplifier circuit is activated during the use of the above configuration, magnetic coupling occurs in the magnetic coupling region so as to weaken each transmission line's magnetic force. When, on the other hand, the second power amplifier circuit is activated during the use of the above configuration, magnetic coupling occurs in the magnetic coupling region so as to strengthen each transmission line's magnetic force. As a result, the second transmission line is apparently short when the first power amplifier circuit is activated, and apparently long when the second power amplifier circuit is activated. Consequently, the aforementioned trade-off problem can be solved to reduce the talk current and decrease the power consumption of the high-frequency power amplifier device.

In short, the representative embodiment of the present invention disclosed in this document is advantageous as it makes it possible to reduce the talk current in the high-frequency power amplifier device.

BRIEF DESCRIPTION OF THE DRAWINGS

FIGS. 2A and 2B are circuit diagrams, in which FIG. 2A is a circuit diagram illustrating in detail an example configuration of essential parts of the high-frequency power amplifier device shown in FIG. 1, and FIG. 2B is a circuit diagram illustrating in further detail an example configuration of a certain portion of FIG. 2A;

FIGS. 3A and 3B show operating principles of the high-frequency power amplifier device shown in FIG. 2A, in which FIG. 3A is a diagram illustrating an example of an operation performed when a sub path is used, and FIG. 3B is a diagram illustrating an example of an operation performed when a main path is used;

FIGS. 4A to 4C show example effects of magnetic coupling during the use of the sub path of the high-frequency power amplifier device shown in FIGS. 2A and 2B, in which FIG. 4A is a complementary diagram illustrating the preconditions for such magnetic coupling, and FIGS. 4B and 4C are diagrams illustrating the results of verification;

FIGS. 5A and 5B show various characteristics exhibited during the use of the high-frequency power amplifier device shown in FIGS. 2A and 2B, in which FIG. 5A is a diagram illustrating the characteristics of power-added efficiency (PAE), and FIG. 5B is a diagram illustrating the characteristics of adjacent channel leakage ratio;

FIGS. 11A to 11C illustrate a high-frequency power amplifier device studied as a premise of the present invention, in which FIG. 11A is a schematic diagram illustrating an example configuration of essential parts of the high-frequency power amplifier device, FIG. 11B is a diagram illustrating exemplary characteristics of a main path shown in FIG. 11A, and FIG. 11C is a diagram illustrating exemplary characteristics of a sub path shown in FIG. 11A.

DETAILED DESCRIPTION

Figure 1:
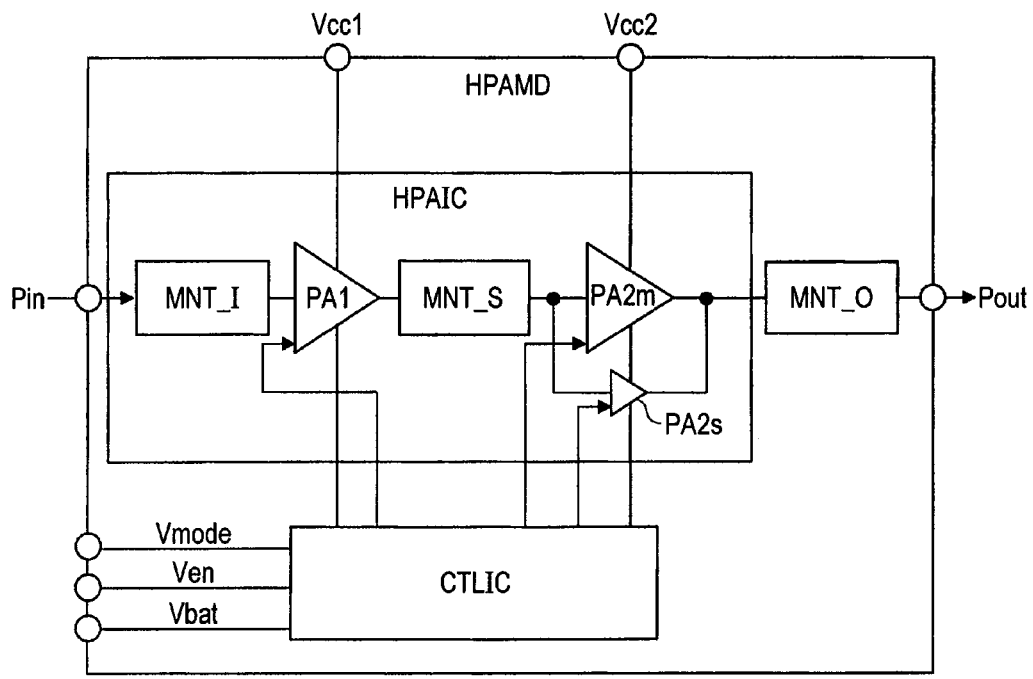
FIG. 1 is a block diagram illustrating an example configuration of a high-frequency power amplifier device according to a first embodiment of the present invention.

In the embodiments described below, if necessary for convenience, the present invention is explained by dividing it into a plurality of sections or embodiments. However, unless otherwise explicitly stated, these sections or embodiments are not irrelevant to each other. There exists such a relationship that, for example, one section or embodiment is a modification, a detailed description, or a complementary explanation of a part or the whole of another section or embodiment. Further, in the embodiments described below, when the number of elements and the like (including, for instance, the number of pieces, numerical values, amounts, and ranges) are referred to, unless otherwise particularly specified or the number is apparently limited to a specified number in principle, the number is not limited to the specified number and may be set to a value higher or lower than the specified number.

Furthermore, in the embodiments described below, it is obvious that components (including element steps) are not always indispensable unless otherwise stated or except the case where the components are apparently indispensable in principle. Similarly, in the embodiments described below, when, for instance, the shapes of the components and the positional relationship between the components are mentioned, the substantially approximate or similar shapes and the like are included therein unless otherwise stated or except the case where it is conceivable that they are apparently excluded in principle. The same holds for the above-mentioned numerical values and ranges.

Although a MOSFET (Metal Oxide Semiconductor Field Effect Transistor) (abbreviated as a MOS transistor) is used in the embodiments as an example of a MISFET (Metal Insulator Semiconductor Field Effect Transistor) (abbreviated as a MIS transistor), a nonoxide film is not excluded as a gate insulating film. While a coupling method for the substrate potential of the MOS transistor is not particularly indicated in the drawings, it is not specifically limited as far as it permits the MOS transistor to operate normally.

Embodiments of the present invention will now be described in detail with reference to the accompanying drawings. In all the drawings illustrating the embodiments, like members are designated by the same reference numerals and will not be redundantly described.

First Embodiment

FIG. 1 is a block diagram illustrating an example configuration of a high-frequency power amplifier device according to a first embodiment of the present invention. The high-frequency power amplifier device (high-frequency power amplifier module) HPAMD shown in FIG. 1 includes, for instance a ceramic wiring circuit board (PCB). A high-frequency power amplifier chip HPAIC and a control chip CTLIC are mounted over the PCB. Further, a wiring layer over the PCB is used to form an output matching circuit MNT_O. The high-frequency power amplifier device HPAMD is for W-CDMA and TDS-CDMA (Time Division Synchronous Code Division Multiple Access) but is not particularly limited to W-CDMA and TDS-CDMA. The high-frequency power amplifier chip HPAIC is a so-called MMIC (Monolithic Microwave Integrated Circuit) and includes an input matching circuit MNT_I, a first-stage power amplifier circuit (power amplifier circuit) PA1, an inter-stage matching circuit MNT_S, and second-stage power amplifier circuits PA2m, PA2s.

The input matching circuit MNT_I provides impedance matching between an external terminal of the high-frequency power amplifier device HPAMD (input power signal Pin) and an input node of the first-stage power amplifier circuit PA1. The first-stage power amplifier circuit PA1 receives a supply voltage Vcc1 through the external terminal of the high-frequency power amplifier device HPAMD, and amplifies a signal input from the input power signal Pin through the input matching circuit MNT_I. The inter-stage matching circuit MNT_S provides impedance matching between an output node of the first-stage power amplifier circuit PA1, which serves as a first stage, and input nodes of the second-stage power amplifier circuits PA2m, PA2s, which serve as a second stage. The second-stage power amplifier circuits PA2m, PA2s receive a supply voltage through the external terminal of the high-frequency power amplifier device HPAMD, allow their input nodes and output nodes to be commonly coupled, and amplify a signal input from the first-stage power amplifier circuit PA1 through the inter-stage matching circuit MNT_S. In this instance, either the second-stage power amplifier circuit PA2m or the second-stage power amplifier circuit PA2s is selected in accordance with a control signal from the control chip CTLIC. The selected second-stage power amplifier circuit is then used to perform an amplification operation.

The output matching circuit MNT_O provides impedance matching between a common output node of the second-stage power amplifier circuits PA2m, PA2s and an external terminal of the high-frequency power amplifier device HPAMD (output power signal Pout). The control chip CTLIC receives a supply voltage Vbat through the external terminal of the high-frequency power amplifier device HPAMD and controls the high-frequency power amplifier chip HPAIC as needed in accordance with a mode setup signal Vmode and an enable signal Ven, which are input through the external terminal of the high-frequency power amplifier device HPAMD. More specifically, when, for instance, the enable signal Ven is at a high level (activated), the control chip CTLIC supplies a bias to the first-stage power amplifier circuit PA1 and the second-stage power amplifier circuit PA2m (or the second-stage power amplifier circuit PA2s) (that is, activates (turns on) the power amplifier circuits). When the enable signal Ven is at a low level (deactivated), the control chip CTLIC shuts off the supply of the bias (that is, deactivates (turns off) the power amplifier circuits). In this instance, the bias is supplied to either the second-stage power amplifier circuit PA2m or the second-stage power amplifier circuit PA2s in accordance with the logic level of the mode setup signal Vmode. For example, a high-frequency signal processing device (not shown) having a modulation function or the like is disposed upstream of the input power signal Pin, and a duplexer, an antenna switch, and an antenna are disposed downstream of the output power signal Pout. The mode setup signal Vmode and the enable signal Ven are generated, for instance, by a baseband processing circuit disposed upstream.

Figure 2A:
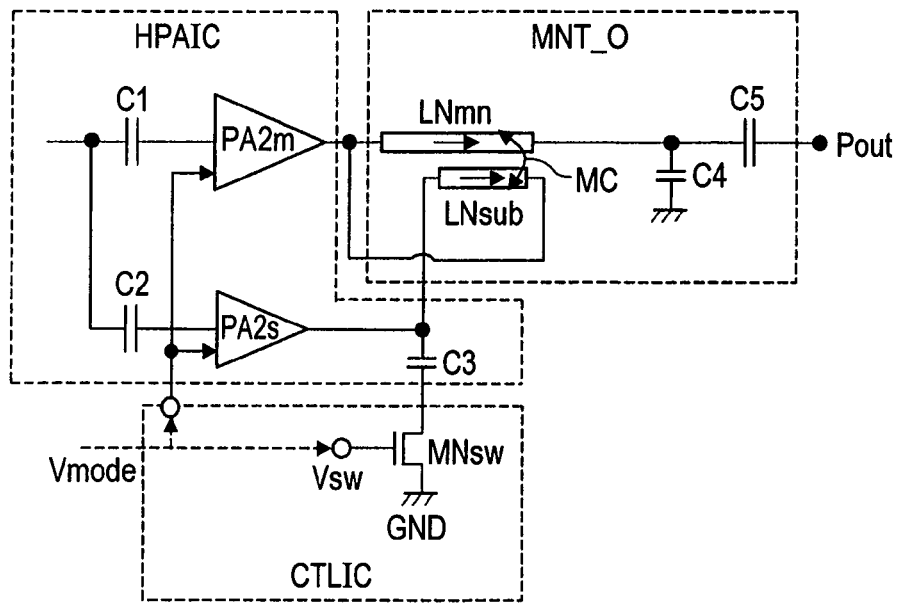
Figure 2B:
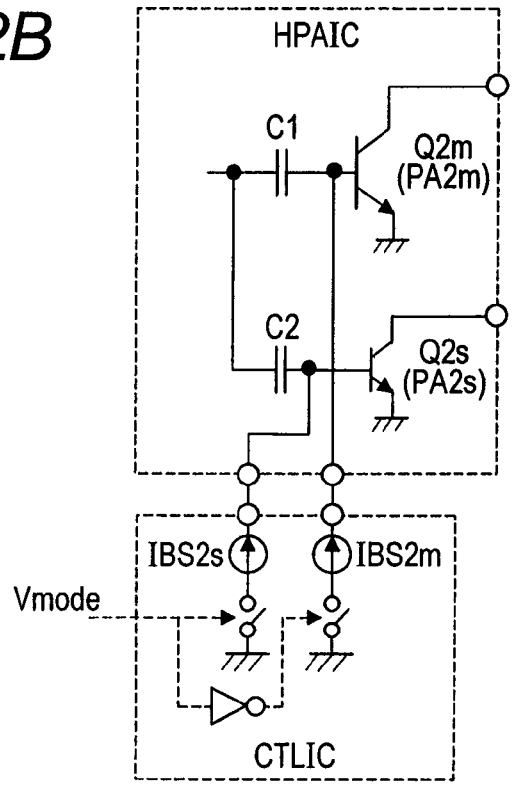

FIG. 2A is a circuit diagram illustrating in detail an example configuration of essential parts of the high-frequency power amplifier device shown in FIG. 1. FIG. 2B is a circuit diagram illustrating in further detail an example configuration of a certain portion of FIG. 2A. Referring to FIG. 2A, the high-frequency power amplifier chip HPAIC includes a capacitance C3 in addition to aforementioned second-stage power amplifier circuits PA2m, PA2s and capacitances C1, C2, which form the inter-stage matching circuit MNT_S. A signal output from the aforementioned first-stage power amplifier circuit PA1 is input into the second-stage power amplifier circuit PA2m through the capacitance C1 and input into the second-stage power amplifier circuit PA2s through the capacitance C2. One end of the capacitance C3 is coupled to an output node of the second-stage power amplifier circuit PA2s. The control chip CTLIC includes a switching n-channel MOS transistor (NMOS transistor) MNsw. The NMOS transistor MNsw includes, for instance, an LDMOS (Laterally Diffused MOS). ON/OFF operations of the NMOS transistor MNsw are controlled by a control signal Vsw input into its gate. Its source is coupled to a ground supply voltage GND, and its drain is coupled to the other end of the capacitance C3. The control signal Vsw is generated in accordance with the mode setup signal Vmode shown in FIG. 1.

As shown in FIG. 2B, the second-stage power amplifier circuits PA2m, PA2s are implemented, for instance, by emitter-grounded npn heterojunction bipolar transistors (HBTs) Q2m, Q2s. The heterojunction bipolar transistor Q2m is larger in transistor size than the heterojunction bipolar transistor Q2s, and has approximately four times the emitter size, for instance, of the heterojunction bipolar transistor Q2s although its emitter size is not particularly limited to as such. The control chip CTLIC supplies a bias current IBS2m to the base of the heterojunction bipolar transistor Q2m and supplies a bias current IBS2s to the base of the heterojunction bipolar transistor Q2s. In accordance with the mode setup signal Vmode shown in FIG. 1, the control chip CTLIC can choose whether or not to supply the bias currents IBS2m, IBS2s.

As described above, a compound semiconductor process involving, for instance, gallium arsenide (GaAs) and silicon germanium (SiGe) is applied to the high-frequency power amplifier chip HPAIC, and a silicon (Si) process (CMOS process) is applied to the control chip CTLIC. Therefore, the high-frequency power amplifier chip HPAIC and the control chip CTLIC are prepared as separate semiconductor chips. However, if a power amplifier circuit can be implemented, for instance, by using an LDMOS, which is inferior in characteristics to a HBT, the high-frequency power amplifier chip HPAIC and the control chip CTLIC can be integrated into a single semiconductor chip. Further, the capacitance C3 can be formed in the output matching circuit MNT_O or in the control chip CTLIC. However, when the capacitance C3 is formed in the high-frequency power amplifier chip HPAIC, it turns out to be beneficial because it reduces the required area and achieves a high Q value. The NMOS transistor MNsw can be configured as a bipolar transistor within the high-frequency power amplifier chip HPAIC. However, when the NMOS transistor MNsw is configured as a MOS transistor within the control chip CTLIC, it can reduce, for instance, the required area and power consumption as compared to a case where the bipolar transistor is used.

Referring to FIG. 2A, the output matching circuit MNT_O includes transmission lines LNmn, LNsub and capacitances C4, C5. One ends of the capacitances C4, C5 are commonly coupled. The other end of the capacitance C4 is coupled to the ground supply voltage GND, and the other end of the capacitance C5 is coupled to the external terminal (output power signal Pout). One ends of the transmission lines LNmn, LNsub are commonly coupled to an output node of the second-stage power amplifier circuit PA2m. The other end of the transmission line LNmn is coupled to one ends of the capacitances C4, C5. The other end of the transmission line LNsub is coupled to the output node of the second-stage power amplifier circuit PA2s (one end of the capacitance C3). In a particular region, the transmission lines LNmn, LNsub are disposed close and parallel to each other to cause magnetic coupling (MC). Further, in this magnetic coupling region, the transmission lines LNmn, LNsub are disposed so that the transmission line LNmn originating from the output node side of the second-stage power amplifier circuit PA2m is extended in the same direction as the transmission line LNsub originating from the output node side of the second-stage power amplifier circuit PA2s. The configuration of this magnetic coupling portion differs from the aforementioned example configuration shown in FIGS. 11A to 11C.

Figure 3A:
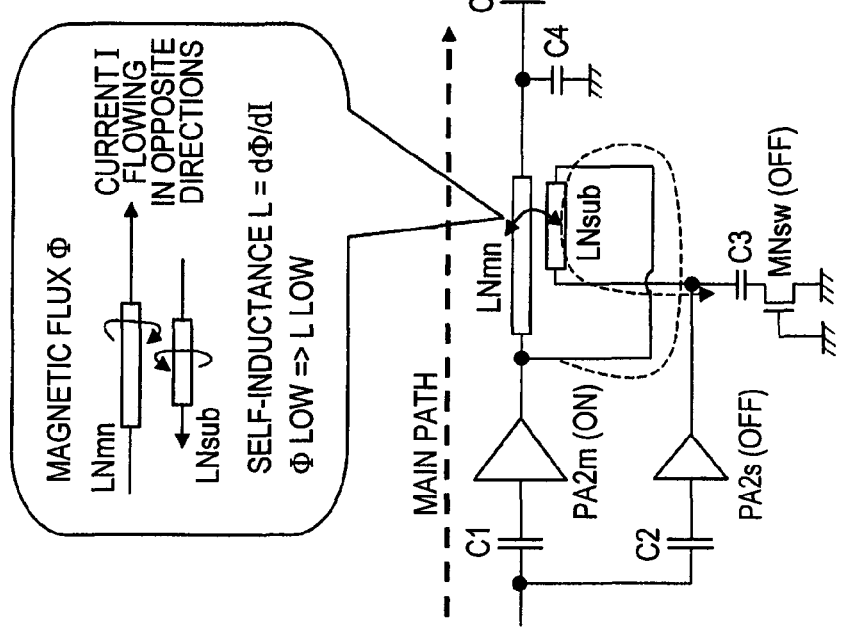
Figure 3B:
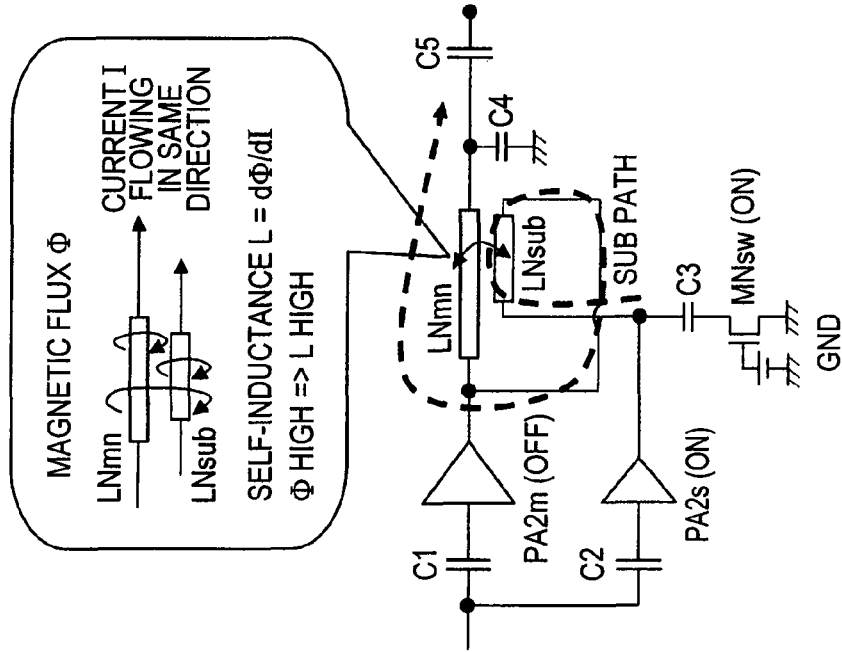

FIGS. 3A and 3B show operating principles of the high-frequency power amplifier device shown in FIG. 2A. FIG. 3A is a diagram illustrating an example of an operation performed when a sub path is used. FIG. 3B is a diagram illustrating an example of an operation performed when a main path is used. Firstly, when the power of the external terminal (Pout) is to be set at a low to medium output level, an operation is performed by using the sub path as shown in FIG. 3A. When the sub path is used, the aforementioned control chip CTLIC exercises control to turn on the second-stage power amplifier circuit PA2s, turn off the second-stage power amplifier circuit PA2m, and turn on the NMOS transistor MNsw. In this instance, a signal output from the second-stage power amplifier circuit PA2s is transmitted to one end of the transmission line LNmn (the output node side of the second-stage power amplifier circuit PA2m) through the transmission line LNsub, and then forwarded to the external terminal (Pout) through the transmission line LNmn. In this case, the NMOS transistor MNsw is on so that the output impedance of the second-stage power amplifier circuit PA2s (e.g., several tens of ohms) is converted to a predetermined impedance (e.g., 50 ohms) through a matching circuit that is formed by the capacitance C3, the transmission line LNsub, the transmission line LNmn, the capacitance C4, and the capacitance C5.

When the sub path is used as described above, a signal (current) flowing in the transmission line LNsub and a signal (current) flowing in the transmission line LNmn agree in the direction of transmission so that the currents flow in the same direction. Magnetic coupling then occurs between a magnetic flux produced by the transmission line LNmn and a magnetic flux produced by the transmission line LNsub so as to strengthen each magnetic flux. As a result, the overall magnetic flux $\Phi$ is increased. When the current flowing in the transmission line LNsub (LNmn) is I, the inductance L of the transmission line LNsub is equal to $d\Phi/dI$. Thus, the inductance L is increased equivalently by an increase in the magnetic flux $\Phi$, which is caused by the aforementioned magnetic coupling. Therefore, when the sub path is used, the magnetic coupling can be utilized so that the length of the transmission line LNsub seems to be equivalently increased.

Secondly, when the power of the external terminal (Pout) is to be set at a high output level, an operation is performed by using the main path as shown in FIG. 3B. When the main path is used, the aforementioned control chip CTLIC exercises control to turn on the second-stage power amplifier circuit PA2m, turn off the second-stage power amplifier circuit PA2s, and turn off the NMOS transistor MNsw. In this instance, a signal output from the second-stage power amplifier circuit PA2m is transmitted to the external terminal (Pout), and the output impedance of the second-stage power amplifier circuit PA2m (e.g., several ohms) is converted to a predetermined impedance (e.g., 50 ohms) through a matching circuit that is formed by the transmission line LNmn, the capacitance C4, and the capacitance C5. In this case, the NMOS transistor MNsw is off. In reality, however, the OFF capacitance of the NMOS transistor MNsw exists as mentioned earlier. Therefore, a leak path may exist through the transmission line LNsub, the capacitance C3, and the NMOS transistor MNsw. When the main path is used as described above, however, a signal (current) flowing in the transmission line LNmn and a signal (leak current) flowing in the transmission line LNsub are transmitted in the opposite directions so that the currents flow in the opposite directions. Magnetic coupling then occurs between a magnetic flux produced by the transmission line LNmn and a magnetic flux produced by the transmission line LNsub so as to weaken each magnetic flux. As a result, on the contrary to the case shown in FIG. 3A, the inductance L in the transmission line LNsub is decreased equivalently. Therefore, when the main path is used, the magnetic coupling can be utilized so that the length of the transmission line LNsub seems to be equivalently decreased.

Consequently, the length of the transmission line LNsub seems to be equivalently increased when the sub path is used and equivalently decreased when the main path is used. This makes it possible to solve the aforementioned trade-off problem. In other words, when the sub path is used, the transmission line LNsub looks long so that adequate impedance matching can be provided. On the other hand, when the main path is used, the transmission line LNsub looks short so that power leakage through the transmission line LNsub can be reduced. In another respect, when, for instance, there is a certain margin in the length of the transmission line LNsub that can be permitted in terms of the characteristics of the main path (that is, when power leakage does not cause a practical problem), the transmission line LNsub can be designed to be shorter when magnetic coupling is used than when magnetic coupling is not used. This makes it possible to reduce the required area.

Figure 4A:
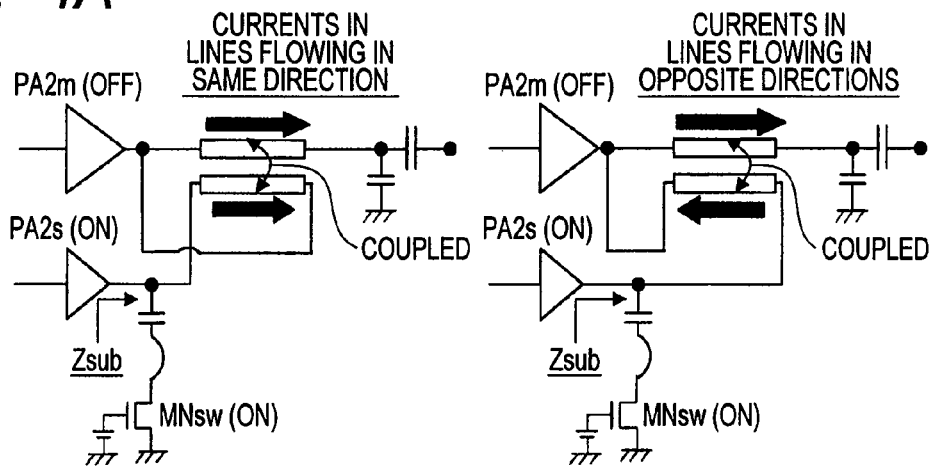
Figure 4B:
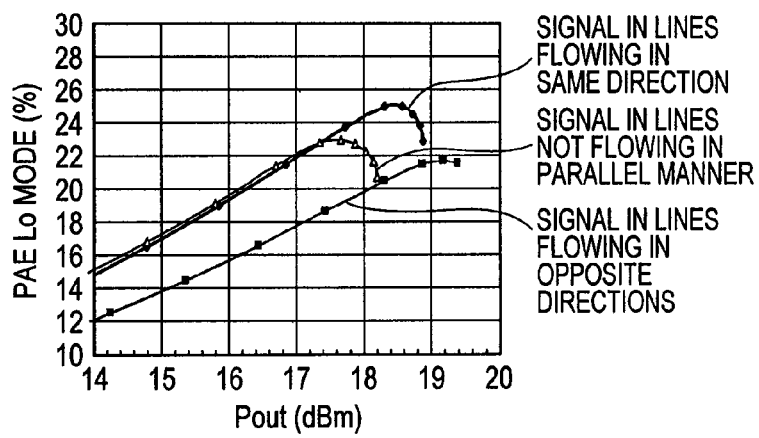
Figure 4C:
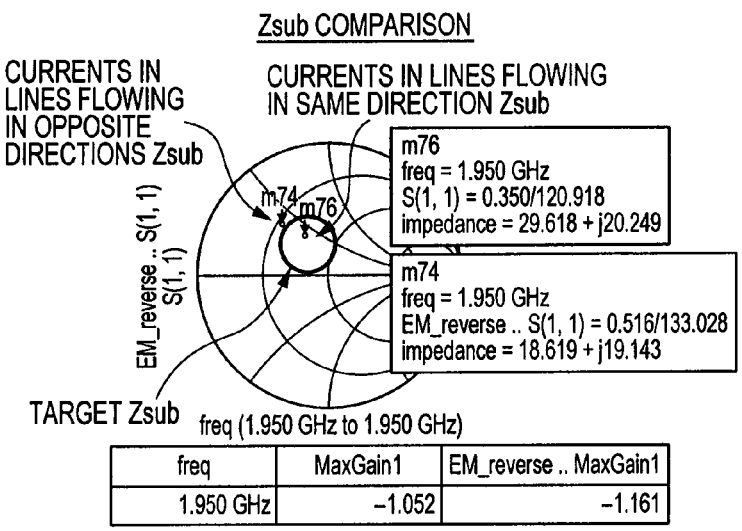

FIGS. 4A to 4C show example effects of magnetic coupling during the use of the sub path of the high-frequency power amplifier device shown in FIGS. 2A and 2B. FIG. 4A is a complementary diagram illustrating the preconditions for such magnetic coupling. FIGS. 4B and 4C are diagrams illustrating the results of verification. First of all, the effects of magnetic coupling were verified by comparing three difference cases. More specifically, the comparison was made on a case where the signals in the lines are transmitted in the same direction as shown in FIG. 4A (when the operation indicated in FIG. 3A is performed), a case where the signals in the lines are transmitted in the opposite directions as shown in FIG. 4A (when the input and output destinations of the transmission line LNsub shown in FIG. 3A are interchanged), and a case where the signals in the lines are not transmitted in a parallel manner (when magnetic coupling is not used as indicated in the configuration example shown in FIGS. 11A to 11C).

As a result, it was found as shown in FIG. 4B that the power-added efficiency (PAE) is higher when the signals in the lines are transmitted in the same direction than when the signals in the lines are transmitted in the opposite directions or are not transmitted in a parallel manner. Referring to FIG. 4B, the verification was performed at a frequency of 1950 MHz and at a supply voltage Vcc2 of 3.4 V. When the signals in the lines are transmitted in the same direction, the range of available output level (Pout) is wider than when the signals in the lines are not transmitted in a parallel manner. Therefore, the second-stage power amplifier circuit PA2s can be used more frequently than the second-stage power amplifier circuit PA2m. This makes it possible to reduce the power consumption. Further, as shown in FIG. 4C, when an attempt was made to match an output impedance Zsub relative to the second-stage power amplifier circuit PA2s, impedance matching relative to a target impedance was accomplished when the signals in the lines were transmitted in the same direction because a sufficient amount of clockwise rotation was obtained for the transmission line LNsub. However, when the signals in the lines were transmitted in the opposite directions, it was difficult to accomplish impedance matching relative to the target impedance as the amount of rotation was insufficient. These findings indicate that the effects of magnetic coupling are produced.

Figure 5A:
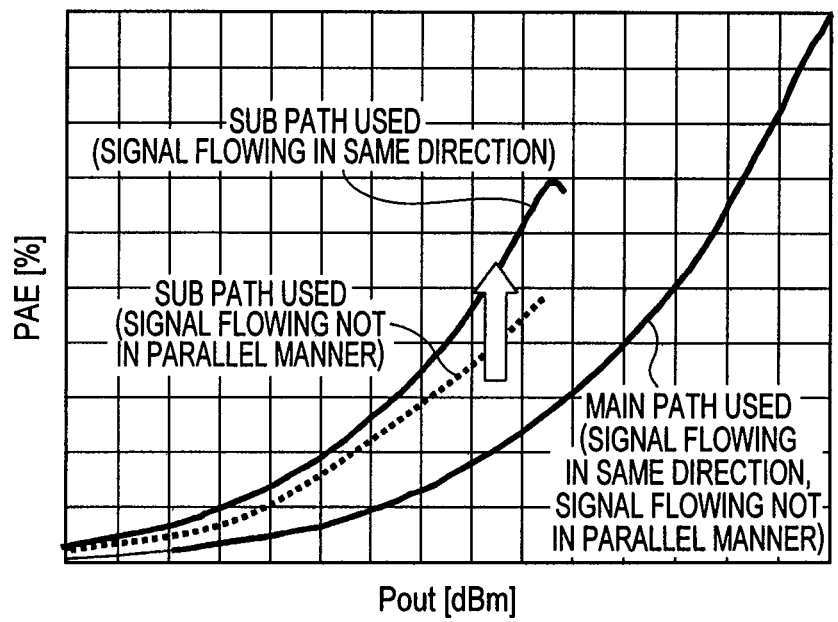
Figure 5B:
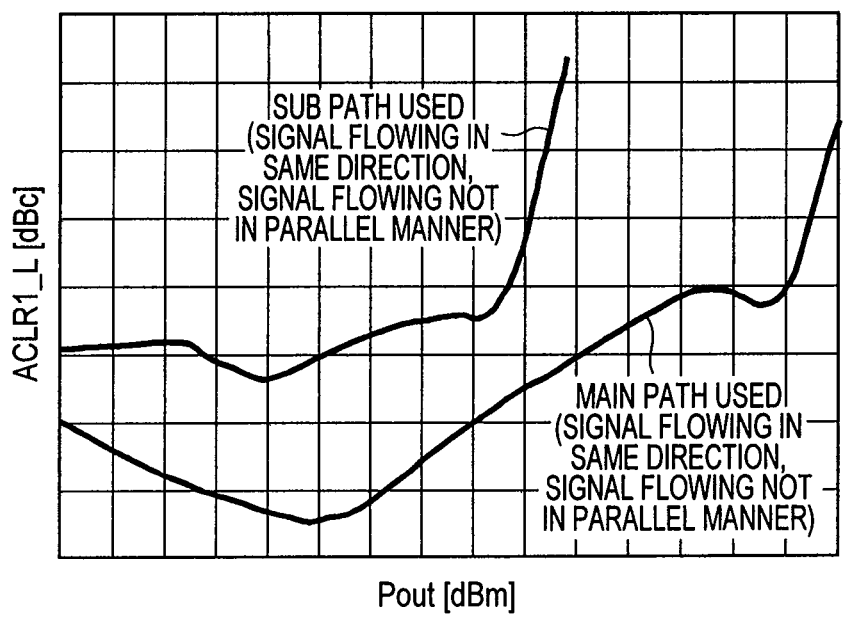
Figure 11A:
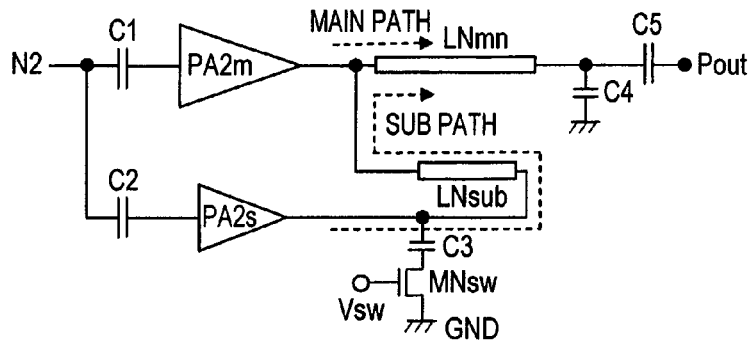
Figure 11B:
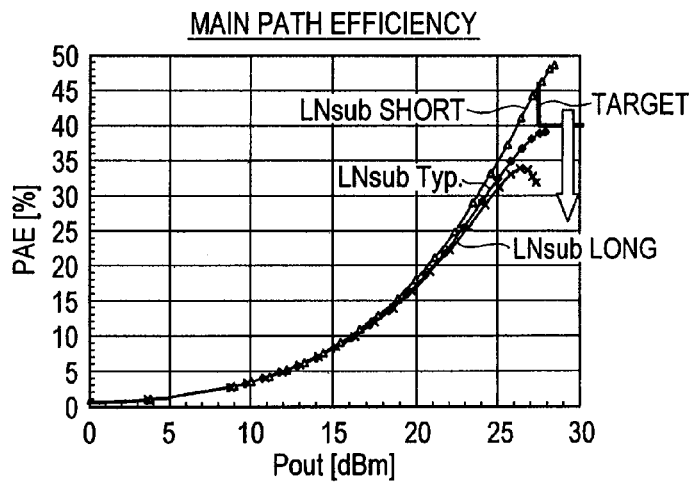
Figure 11C:
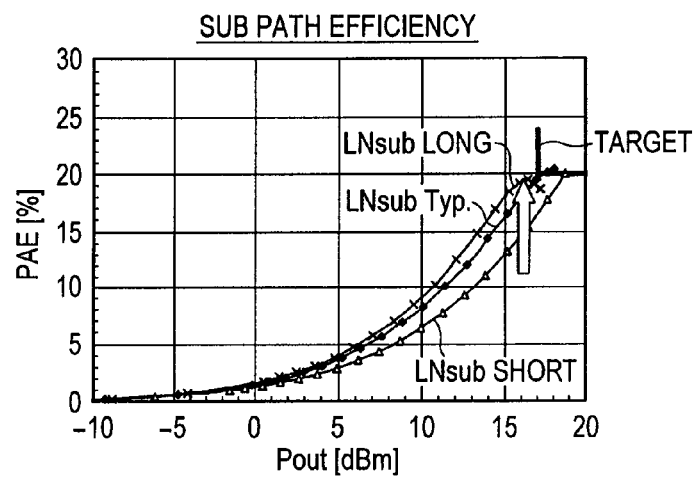
Figure 12:
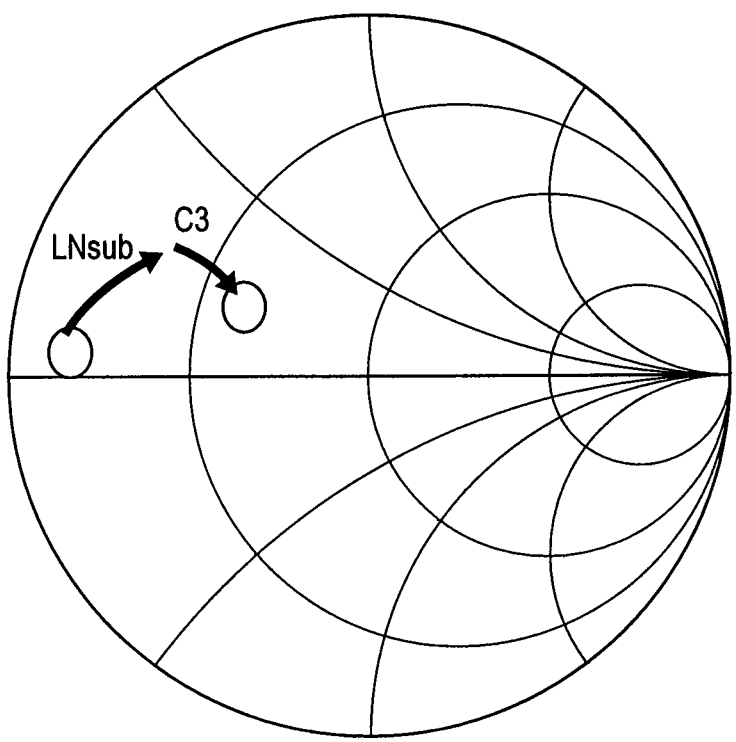
FIG. 12 is a complementary diagram for FIGS. 11A to 11C.

FIGS. 5A and 5B show various characteristics exhibited during the use of the high-frequency power amplifier device shown in FIGS. 2A and 2B. FIG. 5A is a diagram illustrating the characteristics of power-added efficiency (PAE). FIG. 5B is a diagram illustrating the characteristics of adjacent channel leakage ratio (ACLR). Referring to FIGS. 5A and 5B, a comparison is made on a case where the example configurations shown in FIGS. 2A and 2B are used and a case where the example configuration shown in FIGS. 11A to 11C is used while the length of the transmission line LNsub is designed as appropriate so that the same characteristics prevail when the main path is used. As shown in FIG. 5A, if the same PAE prevails during the use of the main path, the PAE prevailing during the use of the sub path is higher when the example configurations shown in FIGS. 2A and 2B are used (when the signals in the lines are transmitted in the same direction) than when the example configuration shown in FIGS. 11A to 11C is used (when the signals in the lines are not transmitted in a parallel manner). This makes it possible to reduce the talk current and decrease the power consumption of the high-frequency power amplifier device. Further, as shown in FIG. 5B, FIGS. 2A and 2B and FIGS. 11A to 11C do not significantly differ in the adjacent channel leakage ratio (ACLR), which represents the amount of distortion. The output level (Pout) for switching between the sub path and main path is set to be as high as possible within a range within which the distortion amount shown in FIG. 5B complies with a predetermined standard and the PAE of the sub path remains unsaturated.

As described above, the use of the high-frequency power amplifier device according to the first embodiment makes it typically possible to reduce the talk current. The first embodiment has been described on the assumption that the high-frequency power amplifier device for W-CDMA is used as it is particularly demanded, for instance, that the talk current be reduced. However, it is obvious that the first embodiment is also applicable to the high-frequency power amplifier device, for instance, for GSM (Global System for Mobile communication) and DCS (Digital Cellular System). Further, the first embodiment has been described on the assumption that a single-band W-CDMA high-frequency power amplifier module is used. However, an alternative is to let the high-frequency power amplifier chip HPAIC shown in FIG. 1 include a plurality of power amplifier circuits such as the first-stage power amplifier circuit PA1 and the second-stage power amplifier circuits PA2m, PA2s or let the high-frequency power amplifier device HPAMD include an additional high-frequency power amplifier chip HPAIC to provide multi-band support.

Second Embodiment

Figure 6:
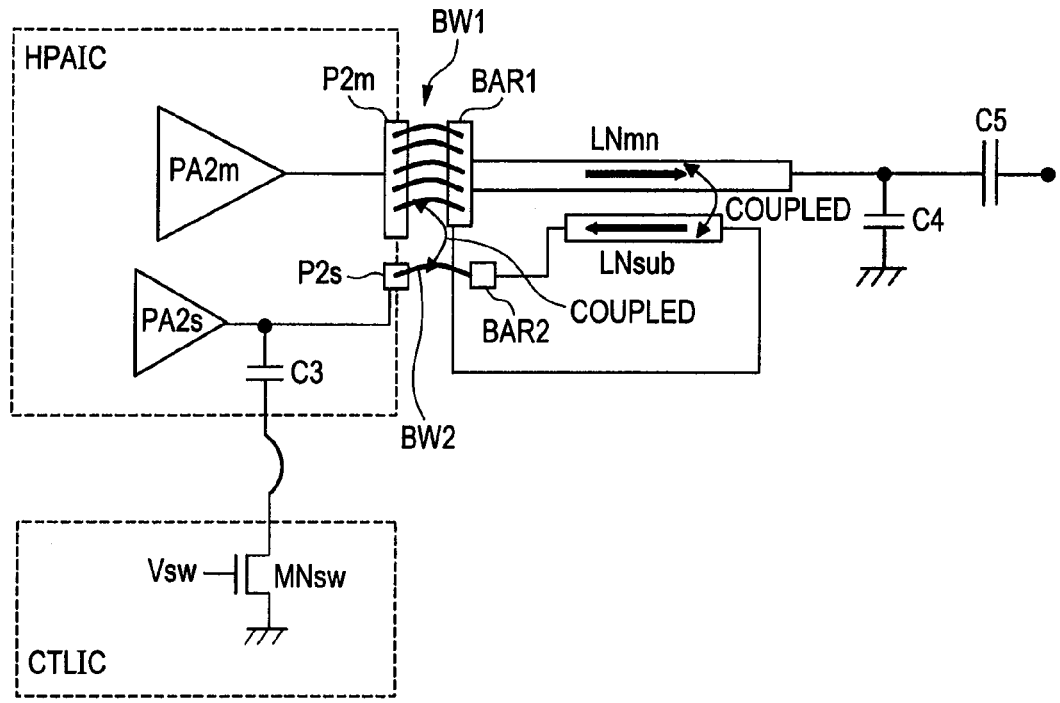
FIG. 6 is a schematic diagram that relates to the high-frequency power amplifier device according to a second embodiment of the present invention and illustrates an example mounting structure based on the configuration examples shown in FIGS. 2A and 2B.

A second embodiment of the present invention will now be described in connection with an example mounting structure based on the configuration examples shown in FIGS. 2A and 2B, which depict the first embodiment. FIG. 6 is a schematic diagram that relates to the high-frequency power amplifier device according to the second embodiment and illustrates an example mounting structure based on the configuration examples shown in FIGS. 2A and 2B. The high-frequency power amplifier device shown in FIG. 6 is obtained by giving a specific form to the joint between the high-frequency power amplifier chip HPAIC and transmission lines LNmn, LNsub in the configuration examples shown in FIGS. 2A and 2B. The configuration of circuitry of the high-frequency power amplifier device shown in FIG. 6 will not be described in detail because it is the same as shown in FIGS. 2A and 2B.

In the high-frequency power amplifier chip HPAIC, the output of the power amplifier circuit PA2m is coupled to an external terminal (electrode pad) P2m, whereas the output of the power amplifier circuit PA2s is coupled to an external terminal (electrode pad) P2s. A bonding area BAR1 is formed at one end of the transmission line LNmn. One end of the transmission line LNsub is coupled to the bonding area BAR1. A bonding area BAR2 is formed at the other end of the transmission line LNsub. The external terminal P2m is coupled to the bonding area BAR1 through a plurality of bonding wires BW1. The external terminal P2s is coupled to the bonding area BAR2 through a bonding wire BW2. The external terminals P2m, P2s are disposed close to each other with the bonding area BAR1 positioned close to the bonding area BAR2 so that magnetic coupling occurs between the bonding wires BW1 and the bonding wire BW2.

When the main path is used (when the power amplifier circuit PA2m is operated) in the above-described configuration, magnetic coupling not only occurs between the transmission lines LNmn, LNsub as mentioned above, but also occurs between the bonding wires BW1 and the bonding wire BW2 in the same direction as the aforementioned magnetic coupling. In other words, when the main path is used, magnetic coupling occurs between the bonding wires BW1 and the bonding wire BW2 in such a manner as to weaken the magnetic force on both sides. Consequently, the difference between an apparent inductance on the transmission line LNsub side during the use of the main path and an apparent inductance on the transmission line LNsub side during the use of the sub path (during an operation of the power amplifier circuit PA2s) is greater than when the configuration examples shown in FIGS. 2A and 2B are used. This makes it possible to further solve the aforementioned trade-off problem.

Third Embodiment

Figure 7:
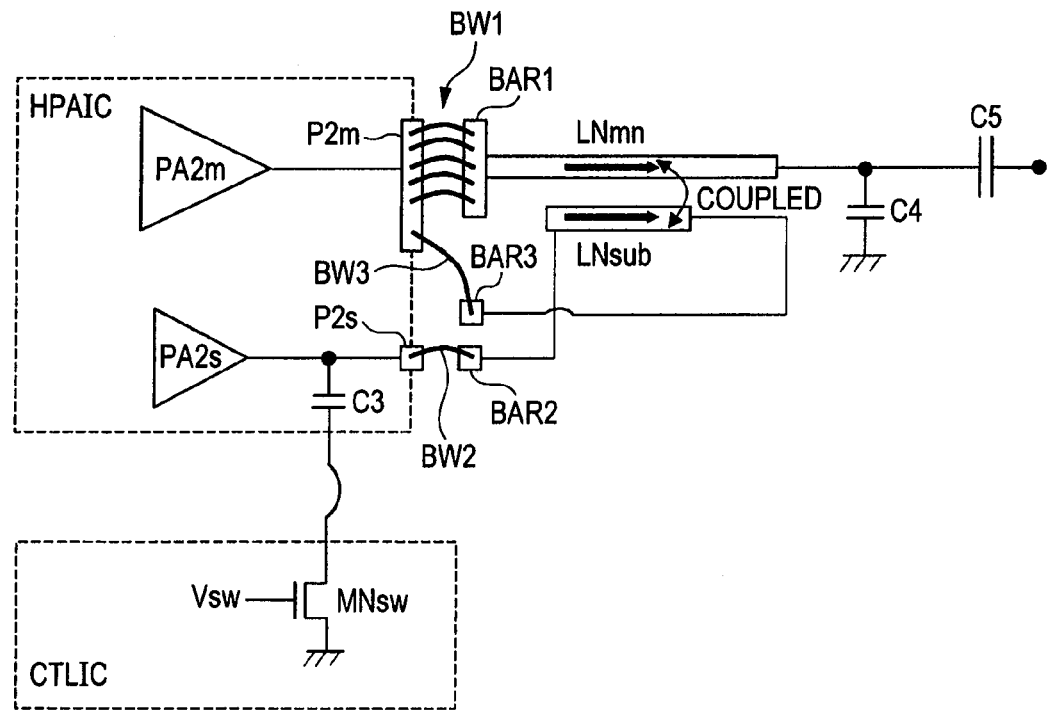
FIG. 7 is a schematic diagram that relates to the high-frequency power amplifier device according to a third embodiment of the present invention and illustrates an example mounting structure based on the configuration examples shown in FIGS. 2A and 2B.

A third embodiment of the present invention will now be described in connection with a modification of the mounting structure shown in FIG. 6, which depicts the second embodiment. FIG. 7 is a schematic diagram that relates to the high-frequency power amplifier device according to a third embodiment of the present invention and illustrates an example mounting structure based on the configuration examples shown in FIGS. 2A and 2B. The high-frequency power amplifier device shown in FIG. 7 is obtained by giving a specific form to the joint between the high-frequency power amplifier chip HPAIC and transmission lines LNmn, LNsub shown in FIGS. 2A and 2B, as is the case with the high-frequency power amplifier device shown in FIG. 6. The configuration of circuitry of the high-frequency power amplifier device shown in FIG. 7 will not be described in detail because it is the same as shown in FIGS. 2A and 2B.

In the high-frequency power amplifier chip HPAIC, the output of the power amplifier circuit PA2m is coupled to the external terminal (electrode pad) P2m, whereas the output of the power amplifier circuit PA2s is coupled to the external terminal (electrode pad) P2s. The bonding area BAR1 is formed at one end of the transmission line LNmn. Unlike the high-frequency power amplifier device shown in FIG. 6, a bonding area BAR3 is formed at one end of the transmission line LNsub, and the bonding area BAR2 is formed at the other end. The external terminal P2m is coupled to the bonding area BAR1 through the bonding wires BW1 and further coupled to the bonding area BAR3 through a bonding wire BW3. The external terminal P2s is coupled to the bonding area BAR2 through the bonding wire BW2. The third embodiment is characterized in that one end of the transmission line LNsub (bonding area BAR3) is coupled to the external terminal P2m through the bonding wire BW3 instead of being coupled to the bonding area BAR1 as shown in FIG. 6. Further, an adequate space is provided between the bonding wires BW3 and BW2 to avoid magnetic coupling.

Figure 8:
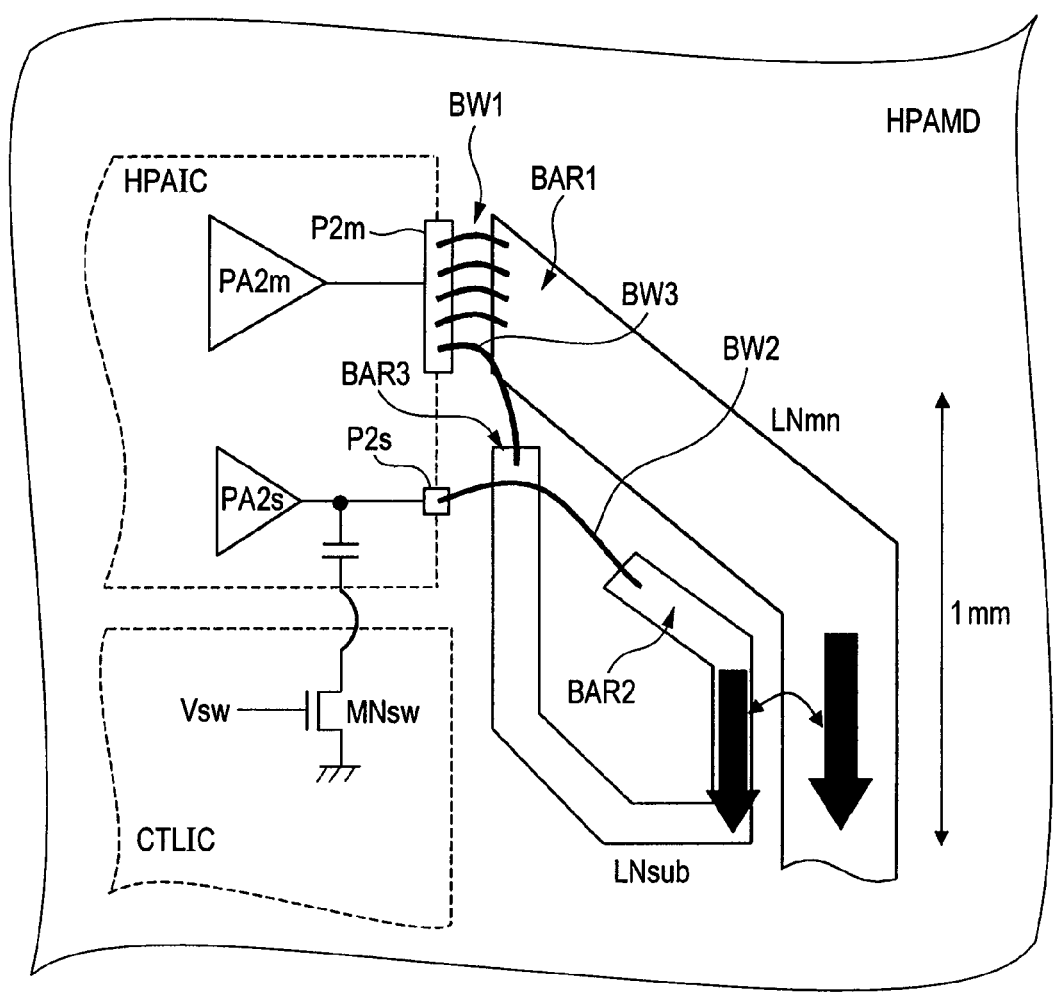
FIG. 8 is a schematic diagram illustrating in detail an example of wiring circuit board layout that uses the mounting structure shown in FIG. 7.

FIG. 8 is a schematic diagram illustrating in detail an example of wiring circuit board layout that uses the mounting structure shown in FIG. 7. Referring to FIG. 8, the high-frequency power amplifier chip HPAIC and the control chip CTLIC are mounted over a wiring circuit board (PCB) that forms the high-frequency power amplifier device HPAMD. Further, the transmission lines LNmn, LNsub are formed over the PCB. The PCB has a multilayer structure that includes, for instance, a ceramic dielectric layer and a copper (Cu) wiring layer. The transmission lines LNmn, LNsub are formed by using the wiring layer. The transmission line LNmn is greater in wiring width than the transmission line LNsub. The transmission lines LNmn, LNsub run close and parallel to each other in a certain region. The parallel portion is 1 mm or less in length. In the parallel portion, the space between the transmission lines LNmn, LNsub is approximately 0.1 mm. The size of the high-frequency power amplifier device HPAMD is reduced so that each side of it is several millimeters in length. In this case, as mentioned earlier, it is difficult to use λ/4 stub wiring or the like.

As described above, when one end of the transmission line LNsub (bonding area BAR3) is coupled to the electrode pad P2m through the bonding wire BW3 during the use of the configuration examples shown in FIGS. 7 and 8, the power loss during the use of the main path can be made lower than when the coupling destination is the bonding area BAR1. In other words, the electrode pad P2m side is lower in impedance than the bonding area BAR1 side because the output impedance of the power amplifier circuit PA2m is, for example, several ohms and converted an impedance, for instance, of 50 ohms through the transmission line LNmn or the like. When the main path is used, the transmission line LNsub side is considered to be a high-impedance circuit. However, when a high-impedance circuit is coupled to a lower-impedance section, the amount of power leakage to the high-impedance circuit side is small due to an impedance ratio. Therefore, when one end of the transmission line LNsub is coupled to the electrode pad P2m side, the power consumption of the high-frequency power amplifier device can be reduced while the aforementioned effect of magnetic coupling between the transmission lines LNmn, LNsub is produced.

The configuration examples shown in FIGS. 7 and 8 do not use the magnetic coupling between the bonding wires BW1, BW2, which is shown in FIG. 6. In some cases, however, it is possible to employ an alternative configuration in which the bonding wires BW1, BW2 are disposed close to each other so as to additionally use the magnetic coupling between the bonding wires BW1, BW2. In such cases, however, it is necessary, for instance, to properly route the transmission line LNsub unlike the case shown in FIG. 6. From the viewpoint, for instance, of ease of size reduction and impedance matching, therefore, it is preferred that the configuration examples shown in FIGS. 7 and 8 be used.

Fourth Embodiment

Figure 9:
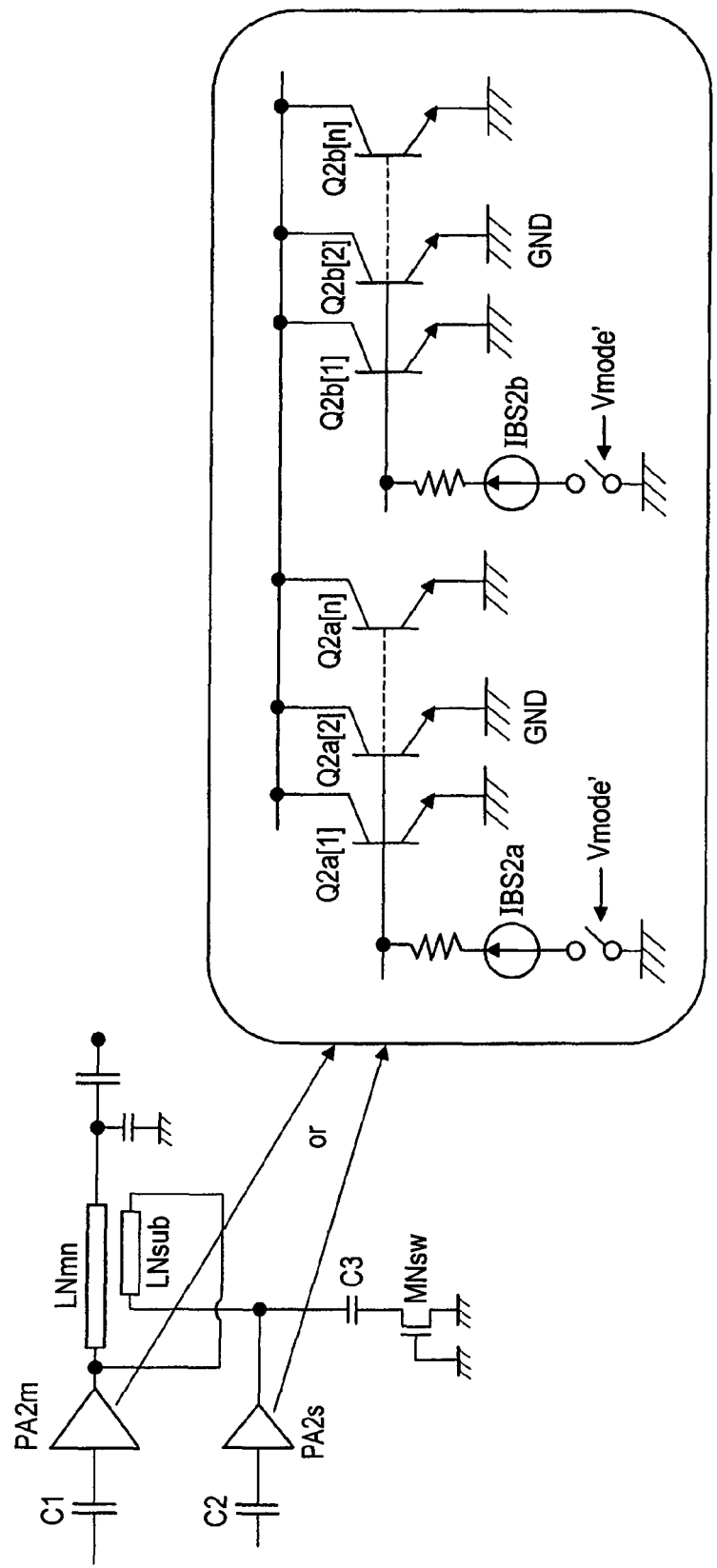
FIG. 9 is a circuit diagram that relates to the high-frequency power amplifier device according to a fourth embodiment of the present invention and illustrates in detail an example configuration of a second-stage power amplifier circuit section shown FIG. 1.
Figure 10:
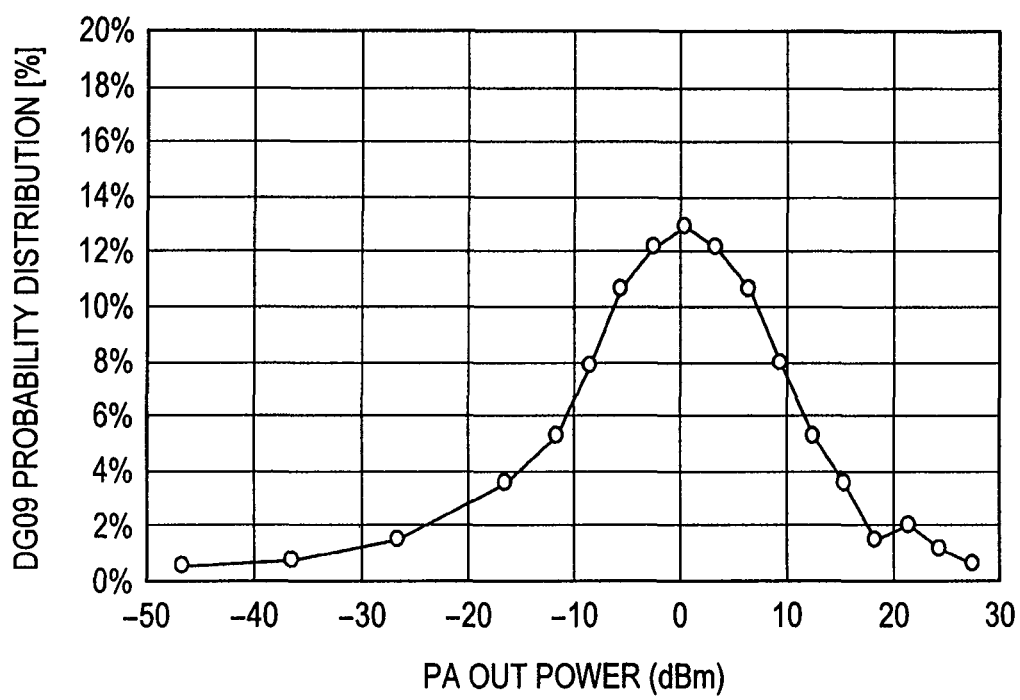
FIG. 10 is a diagram illustrating an example of the probability distribution of each output level use frequency in a W-CDMA mobile phone.

In the example configurations described in connection with the foregoing embodiments, two different operation modes (low to medium output level and high output level) are made available by selecting the second-stage power amplifier circuits PA2m, PA2s. These example configurations can be expanded to an example configuration in which three or more different operation modes (e.g., low output level, medium output level, and high output level) are available. A fourth embodiment of the present invention will now be described in connection with an example configuration in which the high-frequency power amplifier device offers three different operation modes. FIG. 9 is a circuit diagram that relates to the high-frequency power amplifier device according to the fourth embodiment of the present invention and illustrates in detail an example configuration of a relevant portion including the second-stage power amplifier circuits PA2m, PA2s shown FIG. 1.

As shown in FIG. 9, each of the second-stage power amplifier circuits PA2m, PA2s generally includes a plurality of unit transistors to which an emitter, a base, and a collector are commonly coupled. Each unit transistor is called a finger or the like. It is said that each of these power amplifier circuits has a multi-finger structure or the like. To support the three different operation modes, either the power amplifier circuit PA2m or the power amplifier circuit PA2s divides the multi-finger structure into two groups so that a base bias can be supplied to the groups independently.

More specifically, either the power amplifier circuit PA2m or the power amplifier circuit PA2s includes 2×n heterojunction bipolar transistors (unit transistors) Q2a[1]-Q2a[n], Q2b[1]-Q2b[n] to which an emitter and a collector are commonly coupled. A base is commonly coupled to the transistors Q2a[1]-Q2a[n]. A bias current IBS2a is supplied to these transistors through the control chip CTLIC shown in FIG. 1. Similarly, a base is commonly coupled to the transistors Q2b[1]-Q2b[n]. A bias current IBS2b is supplied to these transistors through the control chip CTLIC shown in FIG. 1. Whether or not the bias currents IBS2a, IBS2b are supplied is controlled independently in accordance with a mode setup signal Vmode'. The mode setup signal Vmode' is equipped with three-valued information, for instance, by adding one bit to the earlier-described mode setup signal Vmode (1-bit) having two pieces of information.

If, for instance, the size ratio (number-of-fingers ratio) between the power amplifier circuit PA2m and the power amplifier circuit PA2s is 4:1, a size ratio of PA2m (both groups activated):PA2m (one group activated):PA2s=4:2:1 can be achieved when the power amplifier circuit PA2m is divided into two groups. The size values 4, 2, and 1 are considered to correspond to the high output level, medium output level, and low output level operation modes, respectively. Using these sizes selectively makes it possible to reduce the talk current and decrease the power consumption of the high-frequency power amplifier device while maintaining the aforementioned effect of magnetic coupling between the transmission lines LNmn, LNsub. This will also prevent an increase in the size of the high-frequency power amplifier device. Meanwhile, if a scheme for implementing the three different operation modes by adding another power amplifier circuit is employed as a comparative example, the size of the high-frequency power amplifier device might not be reduced due to an increase, for instance, in the number of terminals and wires over the wiring circuit board. In addition, an appropriate method of achieving the aforementioned magnetic coupling needs to be elaborately devised. Although the fourth embodiment has been described in connection with the example configuration that offers the three different operation modes, four different operation modes can also be implemented by dividing the power amplifier circuit PA2s into two groups as well.

While the present invention contemplated by inventors has been described in terms of preferred embodiments, it will be understood that the present invention is not limited to those preferred embodiments, but extends to various modifications that nevertheless fall within the scope of the appended claims.

The high-frequency power amplifier device according to the embodiments of the present invention is useful particularly when it is applied to the power transmitter of a W-CDMA or TDS-CDMA mobile phone. However, it is also applicable to GSM, DCS, LTE (Long Term Evolution), and other mobile phones based on various standards. Further, it is not only applicable to mobile phones, but is widely applicable to various wireless devices that should preferably be provided with a plurality of output power modes and low in power consumption due, for instance, to their battery-driven capability.

What is claimed is:

1. A high-frequency power amplifier device comprising:
   a first power amplifier circuit that amplifies a first input signal;
   a second power amplifier circuit that amplifies the first input signal;
   a first transmission line that is coupled at one end to an output node of the first power amplifier circuit;
   a first capacitance that is coupled to the other end of the first transmission line;
   a second transmission line that is coupled at one end to the output node of the first power amplifier circuit and coupled at the other end to an output node of the second power amplifier circuit;
   a second capacitance and a transistor switch that are disposed in series between the output node of the second power amplifier circuit and a ground supply voltage; and
   a control circuit that activates either the first power amplifier circuit or the second power amplifier circuit in accordance with a mode setup signal, drives the transistor switch to turn off when the first power amplifier circuit is activated, and drives the transistor switch to turn on when the second power amplifier circuit is activated,
   wherein the first and second transmission lines include a magnetic coupling region that is positioned close to the first and second transmission lines to cause magnetic coupling, and
   wherein, in the magnetic coupling region, the first and second transmission lines are disposed so that the first transmission line originating from the output node side of the first power amplifier circuit is extended in the same direction as the second transmission line originating from the output node side of the second power amplifier circuit.

2. The high-frequency power amplifier device according to claim 1,
   wherein the first power amplifier circuit includes a first transistor that amplifies the first input signal, and
   wherein the second power amplifier circuit includes a second transistor that amplifies the first input signal and is smaller in size than the first transistor.

3. The high-frequency power amplifier device according to claim 2,
   wherein the first and second transistors are bipolar transistors, and
   wherein the transistor switch is a MIS transistor.

4. The high-frequency power amplifier device according to claim 3,
   wherein the first and second power amplifier circuits and the second capacitance are formed over a first semiconductor chip, and
   wherein the transistor switch and the control circuit are formed over a second semiconductor chip.

5. The high-frequency power amplifier device according to claim 2,
   wherein the first power amplifier or the second power amplifier includes a third transistor and a fourth transistor, which are coupled in parallel, and wherein the control circuit further controls the activation and deactivation of the third and fourth transistors independently in accordance with the mode setup signal.

6. A high-frequency power amplifier device comprising:
a first transmission line that is disposed between a first node and a second node;
a second transmission line that is disposed between a third node and a fourth node;
a first power amplifier circuit that amplifies a first input signal and outputs the amplified signal to the first node;
a second power amplifier circuit that amplifies the first input signal and outputs the amplified signal to the third node;
a transistor switch that, when controlled to be on, couples an impedance matching element to the third node, and when controlled to be off, releases the third node; and
a control circuit that activates either the first power amplifier circuit or the second power amplifier circuit in accordance with a mode setup signal, drives the transistor switch to turn off when the first power amplifier circuit is activated, and drives the transistor switch to turn on when the second power amplifier circuit is activated,
wherein the first and second transmission lines are disposed in such a manner that magnetic coupling occurs to weaken each transmission line's magnetic force when the first power amplifier circuit is activated and occurs to strengthen each transmission line's magnetic force when the second power amplifier circuit is activated.

7. The high-frequency power amplifier device according to claim 6,
wherein the first power amplifier circuit includes a first transistor that amplifies the first input signal, and
wherein the second power amplifier circuit includes a second transistor that amplifies the first input signal and is smaller in size than the first transistor.

8. The high-frequency power amplifier device according to claim 7,
wherein the impedance matching element is a capacitance element, and
wherein the capacitance element and the transistor switch are coupled in series between the third node and a ground supply voltage.

9. The high-frequency power amplifier device according to claim 8,
wherein the first and second power amplifier circuits and the impedance matching element are formed over a first semiconductor chip, and
wherein the transistor switch and the control circuit are formed over a second semiconductor chip.

10. The high-frequency power amplifier device according to claim 7,
wherein the first and second transistors are bipolar transistors, and
wherein the transistor switch is a MIS transistor.

11. The high-frequency power amplifier device according to claim 7,
wherein the first power amplifier or the second power amplifier includes a third transistor and a fourth transistor, which are coupled in parallel, and
wherein the control circuit further controls the activation and deactivation of the third and fourth transistors independently in accordance with the mode setup signal.

12. A high-frequency power amplifier device comprising:
a wiring circuit board;
one or more semiconductor chips mounted over the wiring circuit board;
a first transmission line that is formed by a wiring layer over the wiring circuit board and disposed between a first node and a second node;
a second transmission line that is formed by a wiring layer over the wiring circuit board and disposed between a third node and a fourth node; and
a first bonding wire and a second bonding wire,
wherein the one or more semiconductor chips each include:
a first power amplifier circuit that amplifies a first input signal and outputs the amplified signal to a first pad;
a second power amplifier circuit that amplifies the first input signal and outputs the amplified signal to a second pad;
a transistor switch that, when controlled to be on, couples an impedance matching element to the second pad, and when controlled to be off, releases the second pad; and
a control circuit that activates either the first power amplifier circuit or the second power amplifier circuit in accordance with a mode setup signal, drives the transistor switch to turn off when the first power amplifier circuit is activated, and drives the transistor switch to turn on when the second power amplifier circuit is activated,
wherein the first bonding wire couples the first pad to the first node,
wherein the second bonding wire couples the second pad to the third node,
wherein the fourth node is coupled to the first pad or the first node, and
wherein the first and second transmission lines include a magnetic coupling region that is positioned close to the first and second transmission lines to cause magnetic coupling, and are disposed in the magnetic coupling region so that the first transmission line originating from the output node side of the first power amplifier circuit is extended in the same direction as the second transmission line originating from the output node side of the second power amplifier circuit.

13. The high-frequency power amplifier device according to claim 12,
wherein the first power amplifier circuit includes a first transistor that amplifies the first input signal, and
wherein the second power amplifier circuit includes a second transistor that amplifies the first input signal and is smaller in size than the first transistor.

14. The high-frequency power amplifier device according to claim 13, wherein the first bonding wire and the second bonding wire are disposed close to each other so as to cause magnetic coupling.

15. The high-frequency power amplifier device according to claim 13, further comprising:
a third bonding wire,
wherein the third bonding wire couples the first pad to the fourth node.

16. The high-frequency power amplifier device according to claim 13,
wherein the impedance matching element is a capacitance element, and
wherein the capacitance element and the transistor switch are coupled in series between the second pad and a ground supply voltage.

17. The high-frequency power amplifier device according to claim 16, wherein the first and second power amplifier circuits and the capacitance element are formed over a first semiconductor chip,
wherein the transistor switch and the control circuit are formed over a second semiconductor chip,
wherein the first and second transistors are bipolar transistors, and
wherein the transistor switch is a MIS transistor.

18. The high-frequency power amplifier device according to claim 13,
wherein the first power amplifier or the second power amplifier includes a third transistor and a fourth transistor, which are coupled in parallel, and
wherein the control circuit further controls the activation and deactivation of the third and fourth transistors independently in accordance with the mode setup signal.

* * * * *